United States Patent [19]

Levenson

[11] 3,933,615
[45] Jan. 20, 1976

[54] FLUID FLOW STRIPPING AND PLATING SYSTEM

[75] Inventor: Elliott R. Levenson, Mission Viejo, Calif.

[73] Assignee: The United States of America as represented by the Secretary of the Air Force, Washington, D.C.

[22] Filed: June 9, 1969

[21] Appl. No.: 831,325

[52] U.S. Cl. .............................................. 204/275
[51] Int. Cl.² ........................................ C25B 9/00
[58] Field of Search ............ 204/224, 275, 276, 237

[56] References Cited
UNITED STATES PATENTS

| | | | |
|---|---|---|---|
| 3,324,022 | 6/1967 | Keeleric | 204/275 |
| 3,361,662 | 1/1968 | Sutch | 204/224 |
| 3,441,488 | 4/1969 | Onstott | 204/275 |
| 3,445,372 | 5/1969 | Fromson | 204/224 |
| 3,468,785 | 9/1969 | Polichette | 204/224 |
| 3,475,303 | 10/1969 | Sadler et al. | 204/224 |
| 3,479,273 | 11/1969 | Taylor et al. | 204/224 |
| 3,506,546 | 4/1970 | Semienko et al. | 204/237 |
| 3,515,659 | 6/1970 | Broat et al. | 204/224 |

*Primary Examiner*—John H. Mack
*Assistant Examiner*—C. F. LeFevour
*Attorney, Agent, or Firm*—Joseph E. Rusz; Charles C. Allshouse

[57] ABSTRACT

The system comprises at least one device which includes an electrode and a fluid cavity both extending the longitudinal length of the circuit board adjacent to the portion of the board involved. Ordinarily, the terminal contacts along one edge of the board are to be stripped of, for example, tin-lead solder or plated with, for example, gold. The portion of the board to be plated or stripped, is made the other electrode. The electrode of the device is spaced from the contacts so that the fluid from the cavity flows evenly over the surface of the contact pads. Current passes from the electrode through the fluid to the board surface to either strip or plate, depending on the application of the system. The polarities of the electrodes are reversed for plating and stripping and the solution is changed.

6 Claims, 2 Drawing Figures

FLUID FLOW STRIPPING AND PLATING SYSTEM

BACKGROUND OF THE INVENTION

1. Field of the Invention

The invention relates to a fluid flow stripping and plating system and, more particularly, to such a system in which an electrode is disposed adjacent to a circuit board to be plated and/or stripped for passing current through a fluid flowing evenly over the portion of the circuit board involved.

2. Description of the Prior Art

In order to produce circuit boards, it is necessary to be able to strip, or etch away, solder from the portions of the circuit pattern comprising the terminal contact pads of a circuit board. The terminal pads are ordinarily inserted into a terminal board connector comprising part of an electronic system. After the solder is etched away from the terminal pad portion, it is necessary then to gold plate over the copper exposed during the etching process. Gold adheres better to the copper than to solder.

In the past, the boards have been masked and dipped into an acid solution for removing the solder and, subsequently, gold-plated according to known techniques. In another method, a carbon electrode wrapped in a cloth has been dipped in an acid etchant and brushed across the portion of the board to be stripped. Both processes are relatively inefficient and consume considerable periods of time. The tool and workpiece must be moved relative to each other.

A system is desired in which the solder can be etched away from the terminal contact pads of the circuit board at a relatively fast and efficient rate. It would also be preferred if the system could be used to plate gold on the etched copper contact pads. The system described herein provides an efficient fluid flow stripping and plating system which is an improvement over the processes described above.

SUMMARY OF THE INVENTION

Briefly, the invention comprises a system for evenly flowing a fluid over a selected portion of a circuit board, usually the terminal contact pads, for removing a material such as solder from copper or for plating a material such as gold over the copper contact pads of the circuit board. The system includes a longitudinal extending electrode disposed adjacent to, but separated from, the contact pads being etched or plated. Fluid from a longitudinally extending cavity flows between the electrode and the contact terminals. Current passes through the fluid to either etch or plate the contact pads. The circuit board contact pads are polarized as an electrode of opposite polarity.

During the etching, or stripping process, an etchant solution is passed over the contact pads. For the plating process, the polarities of the board and the electrode adjacent to the board are reversed, and a plating solution is passed over the contact pads.

Therefore, it is an object of this invention to provide an improved system and process for etching a material from a base material.

It is another object of this invention to provide an improved system for plating a material over a base material.

A still further object of this invention is to provide an improved etching and plating system in which the etchant and/or the plating solution is passed over a selected portion of a circuit board.

A still further object of this invention is to provide a fluid flow etching and/or plating system using a longitudinally extending electrode and cavity for equally flowing a fluid over a portion of a circuit board while simultaneously passing a current through the fluid to either remove one material from the base material or to plate a material over a base material depending on the application of the system.

A still further object of the invention is to provide an improved system for stripping, or etching, solder from a copper base material comprising the contact pads of a circuit board which does not involve dipping a board into an acid etchant.

A further object of the invention is to provide a stripping and/or plating system which does not require the use of a rubbing device to remove and/or plate one material from or onto a base material.

A still further object of this invention is to provide a fluid flow etching and plating system which can remove solder from a copper base at a relatively fast rate and which can plate gold over a copper base at a relatively fast rate.

Another object of this invention is to provide a system for removing and/or plating a material on or from, as the case may be, a circuit board which does not require a relative movement of the system and the circuit board during the removing and/or plating operation.

These and other objects of the invention will become more apparent when taken in connection with the description of the drawings, a brief description of which follows:

DESCRIPTION OF THE PREFERRED EMBODIMENT

Figure 1:
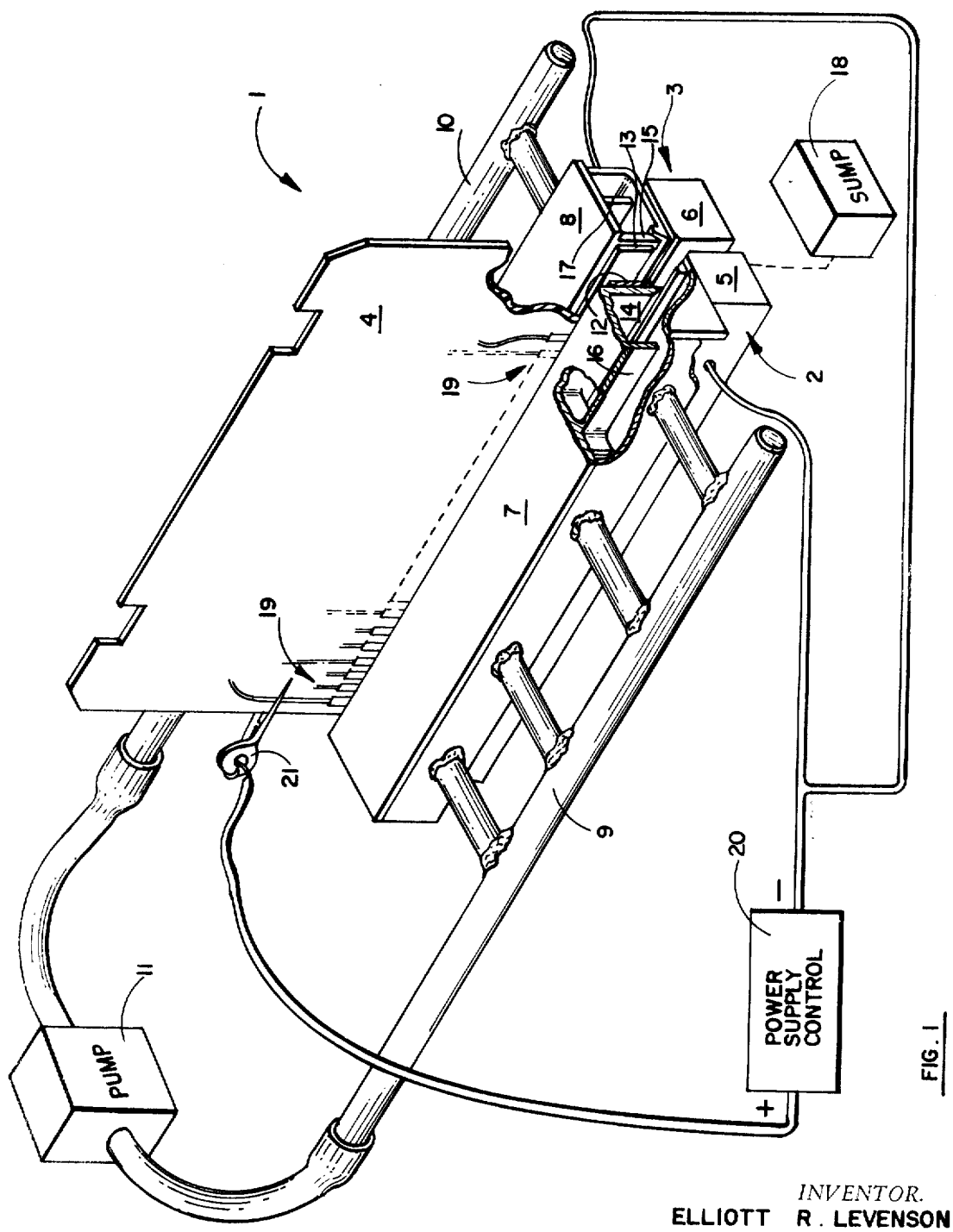
FIG. 1 is a perspective view of one embodiment of a system using two fluid flow etching and plating devices.

FIG. 1 is a perspective view of one embodiment of etching and plating system 1 comprising individual devices 2 and 3 having longitudinal lengths equal to that of circuit board 4 which is disposed between the devices. In other embodiments, only one device may be required. The devices include longitudinal electrode 5 and 6 comprised of a material such as carbon having a rectangular shape. The electrodes provide for equal distribution of current along the adjacent surfaces of the circuit board.

Cavity members 7 and 8, comprised of a non-corrosive material such as stainless steel, are connected on top of the electrodes 5 and 6 respectively. The cavities include tubing 9 and 10 connected at the back sides of the members to direct fluid into the cavities from a source such as pump 11. The other sides of the cavities are open and slightly beveled (as shown more clearly in FIG. 2) to match the beveled edge of the electrodes.

Spacers 12 and 13 are affixed to the sides 14 and 15 of cavities 7 and 8 respectively for displacing the sides of the electrodes from the surfaces of the circuit board and to permit fluid to flow from the openings of the cavities across the surfaces of the circuit board adjacent to the electrodes. The spacers provide an initial emf gap between the electrode and the circuit board.

Figure 2:
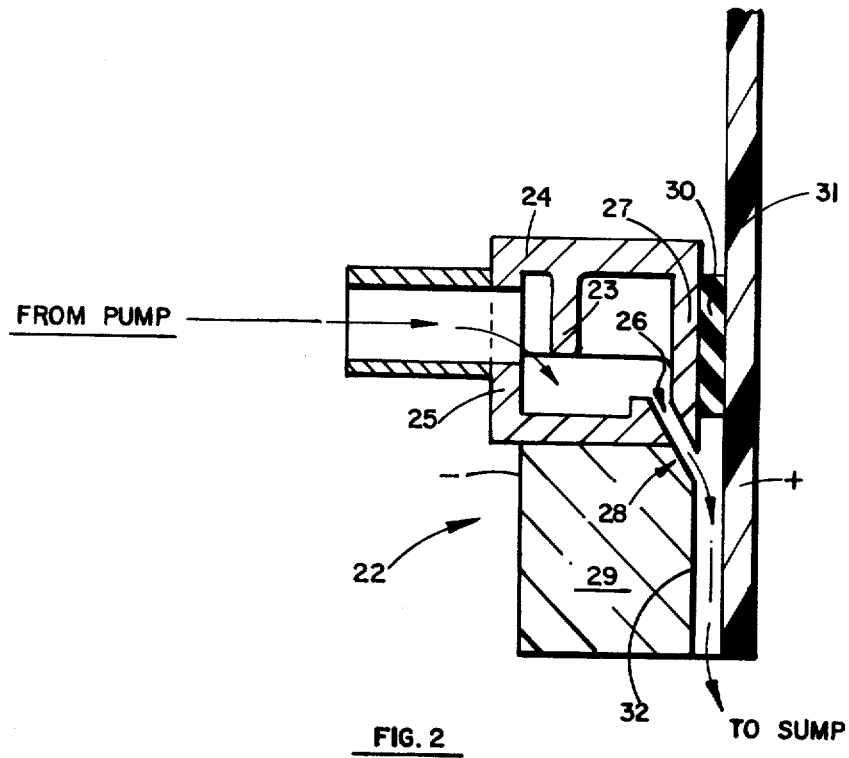
FIG. 2 is an end view of one embodiment of a fluid flow etching and plating device.

The spacers may be comprised of a rubber strip or other material non-reactive with the fluid passing through the openings above the beveled edges. In addition, the spacer prevents fluid from flowing in the opposite direction as it passes from the openings. FIG. 2 illustrates the function of the spacers more clearly.

Walls 16 and 17 of the cavities form channels adjacent to tubings 9 and 10. The walls connected to the inner surface of the top of the cavities have heights which permit the fluid to flow out of the channels into the open portions of the cavities on the opposite side of the wall adjacent to the cavity openings (see FIG. 2). The walls remove air bubbles from the fluid and direct the flow of fluid so that the fluid flows evenly over the surface of the circuit board. Ordinarily, the tube, the cavity, and wall are formed simultaneously. The parts of the devices may be combined by a suitable adhesive which is non-reactive to the chemical elements involved.

Pump 11 supplies fluid, either an etchant or a plating fluid, through tubing 9 and 10 of the devices 7 and 8. The system further comprises sump, or reservoir, 18 for collecting the fluid as it passes from the respective openings of cavities 7 and 8 of the devices past the contact pads 19 of circuit board 4. The contact pads are not shown in great detail since they are known to persons skilled in the art.

The appropriate contact pads of circuit board 4 are connected to power supply and control circuit 20 by clip 21 and to the electrodes 5 and 6. The power supply is used to polarize the circuit board to a polarity opposite that of the electrodes. The control portion of the power supply 20 may be implemented by a current switch to disconnect the electrodes from the power supply when the current level through the circuit board falls below a certain value. For example, when the power supply is turned on, the current through the board may be approximately 40 amps. Whereas, after the tin-lead solder has been etched away the current drops to 10 amps. When the current switch detects the 10 amp level, the power supply is turned off or otherwise disconnected from the electrode.

FIG. 2 is a cross-sectional end view of one etching and plating device 22. The end section has been removed to more clearly illustrate the position of wall 23 which forms a channel at the rear of cavity 24. The channel is between the openings in the wall 25 through which fluid is directed and the opening 26 in the opposite wall 27 for directing the fluid towards the circuit board 31. The opening is beveled to match the beveled edge 28 of the electrode 29 and is configured to control the pressure of the fluid from the cavity. As a result, the fluid is directed downward across the face of the circuit board under a controlled pressure.

Spacer 30, affixed to the outer surface of side 27, is comprised of nonreactive material such as a close celled nitrogen filled chlorophene rubber. The spacer has a thickness so that the device 22 is separated from the circuit board by an amount to permit the fluid to flow from opening 26 across the contact pads of the circuit board and between side 32 of the electrode 29.

Depending upon the particular application of the system, either for etching or plating, the system performs the process on both sides of the board simultaneously. Ordinarily, the system is used to etch tin-lead solder from the copper base of the contact pads at the edge of the circuit board and, subsequently, plate the copper pads with gold.

When the system is operated as an etching, or stripping, system, for example, to remove solder plating from the copper terminal pads at the edge of a circuit board, an acid etchant such as fluoroboric acid is passed through the openings of the devices 11 and 13 so that it flows evenly over the face of the circuit board. The circuit board is connected to the plus terminal 21 of the power supply 20, and the electrodes 5 and 6 are connected to the minus terminal of the power supply. The current passes through the solution to the polarized solder so that the solder is very quickly and efficiently removed from the copper base material. For example, fluid may be pumped from the source at a rate of approximately 2.5 gallons per minute. While the power supply may be set at approximately 10 volts, from 3 to 5 seconds would be required to strip the tin-lead solder from a 5 × 9 inch circuit board at the contact pad area.

It is pointed out that although the fluid is an electrolyte which permits current to be conducted from the electrode into the circuit board, it also provides a mechanical cleansing effect to remove the material etched away by the combined action of the current and the fluoroboric acid. In other systems using an acid etchant, it is actually necessary to mechanically rub or wash away the etched material. One of the advantages of the system described herein is that the device is clamped in a fixed position against the circuit board and a relative movement between the device and the circuit board is not required.

The system may be used to plate gold onto the exposed copper pads. After the solder has been removed, the fluid is changed from an acid etchant to a plating solution containing gold; and the polarization of the electrode is reversed. In other words, the copper base of the circuit board is made the minus (−) electrode and the electrodes 20 and 21 of the devices are made the positive (+) electrodes. For that embodiment, the gold is deposited onto the copper base as the fluid flows evenly across the polarized terminal pads.

I claim:

1. A fluid flow stripping and plating system for removable circuit boards and having a fluid source containing a fluid therein, comprising in combination:

Electrical contact means for connection to a removable circuit board having terminal contacts adapted to be energized with a voltage of one polarity;

First cavity means having a first opening therein said first opening being in a side of the first cavity means;

A first electrode connected to said first cavity means and extending the length of said first cavity means;

Means for spacing said first cavity means from said circuit board for permitting said fluid to flow from the first opening between said first electrode and said circuit board and across said terminal contacts when said circuit board is inserted in said system;

A second cavity means having a second opening therein, said second opening being in a side of said second cavity means and having a length of at least equal to that of said first cavity means;

A second electrode connected to said second cavity means and extending the length of said second cavity means;

said first and second electrodes being adapted to be energized with a voltage of the opposite polarity; and A second means for spacing said second cavity means from said circuit board for permitting said fluid to flow from the second opening between said second electrode and said circuit board and across said terminal contacts when said circuit board is interposed between said first and second electrodes, said first and second electrodes being composed of carbon.

2. The combination recited in claim 1, wherein:
said fluid source providing a supply of the fluid therefrom into either of said cavity means, either of said cavity means including means for removing bubbles from said openings, said openings having configurations for providing predetermined fluid pressure.

3. The combination recited in claim 1, including:
means for connecting said first electrode to a voltage having one polarity and the portion of said circuit board adjacent to said first electrode to a voltage having another polarity for providing electrodes of opposite polarities for removing metal from the metallic portions of said circuit board when said fluid flows across the portion of the circuit board adjacent to said first electrode.

4. The combination recited in claim 1, wherein said fluid is a plating solution.

5. The combination recited in claim 1, wherein:
at least one of said openings having a configuration for providing control of the pressure of said fluid so as to enable removal of material etched from said circuit board.

6. The combination recited in claim 1 wherein the first and second electrodes connected to the respective first and second cavity means adjacent the respective first and second openings, said first and second electrodes being configured as an extension to said first and second openings whereby the permitted flow is guided across said circuit board when the latter is interposed between said first and second electrodes.

* * * * *